United States Patent
Brown et al.

(10) Patent No.: US 6,677,073 B1
(45) Date of Patent: Jan. 13, 2004

(54) NON-WOVEN FIBER WEBS

(75) Inventors: Karen Leanne Brown, Reading (GB);
Susan Joy Cooper, Reading (GB);
John Malcolm Gascoyne, Bucks (GB);
Thomas Robertson Ralph, Reading (GB)

(73) Assignee: Johnson Matthey Public Limited Company, London (GB)

( * ) Notice: Subject to any disclaimer, the term of this patent is extended or adjusted under 35 U.S.C. 154(b) by 319 days.

(21) Appl. No.: 09/594,861

(22) Filed: Jun. 15, 2000

(30) Foreign Application Priority Data

Jun. 22, 1999 (GB) ............................................... 9914492

(51) Int. Cl.$^7$ ........................... H01M 4/86; H01M 4/90; H01M 4/96; D04H 1/00; D04H 13/00
(52) U.S. Cl. ........................... 429/42; 429/44; 442/341; 442/342; 442/344
(58) Field of Search ............................... 429/34, 30, 42, 429/44; 442/327, 334, 361, 376, 344, 349, 341; 502/101

(56) References Cited

U.S. PATENT DOCUMENTS

| | | | | |
|---|---|---|---|---|
| 3,991,169 A | * | 11/1976 | Makita et al. ............... 423/445 |
| 4,017,663 A | * | 4/1977 | Breault ......................... 429/12 |
| 4,135,029 A | | 1/1979 | Pfeffer |
| 4,634,612 A | | 1/1987 | Nelson et al. |
| 5,236,687 A | * | 8/1993 | Fukuda et al. ............ 423/447.2 |
| 5,441,822 A | * | 8/1995 | Yamashita et al. ............. 429/34 |
| 5,567,500 A | * | 10/1996 | Marshall et al. .............. 428/116 |
| 6,140,266 A | * | 10/2000 | Corrigan et al. ............. 502/439 |
| 6,183,898 B1 | * | 2/2001 | Koschany et al. ............. 429/42 |
| 6,352,948 B1 | * | 3/2002 | Pike et al. .................... 442/384 |

FOREIGN PATENT DOCUMENTS

| | | |
|---|---|---|
| EP | 0 286 945 | 10/1988 |
| EP | 0 506 051 | 9/1992 |
| EP | 0 791 974 | 8/1997 |
| GB | 702846 | 1/1954 |
| GB | 746 021 | 3/1956 |
| GB | 1 013 039 | 12/1965 |
| GB | 1 226 378 | 3/1971 |
| GB | 1 293 685 | 10/1972 |
| GB | 1 511 305 | 5/1978 |

\* cited by examiner

*Primary Examiner*—Patrick Ryan
*Assistant Examiner*—Julian Mercado
(74) *Attorney, Agent, or Firm*—RatnerPrestia

(57) ABSTRACT

A novel non-woven fiber web comprising a plurality of first fibers orientated in the x-, y-, and optionally z-directions, said first fibers being bonded with a polymeric substance, characterised in that one or more continuous strands are embedded within the sub-surface layer of the non-woven fiber web, each continuous strand comprising a plurality of second carbon fibers, is disclosed. A gas diffusion substrate, electrode and membrane electrode assembly comprising said web is also disclosed, all of which may have application in electrochemical devices, for example in a fuel cell.

17 Claims, No Drawings

NON-WOVEN FIBER WEBS

The present invention relates to a novel non-woven fibre web with continuous reinforcing strands, a porous gas diffusion substrate, a porous gas diffusion electrode and a membrane electrode assembly, all of which may have application in electrochemical devices, for use for example in a fuel cell. The invention further relates to a process for the manufacture of the web, substrate, electrode and membrane electrode assembly.

Electrochemical cells invariably comprise at their fundamental level a solid or liquid electrolyte and two electrodes, the anode and cathode, at which the desired electrochemical reactions take place. A fuel cell is an energy conversion device that efficiently converts the stored chemical energy of its fuel into electrical energy by combining either hydrogen, stored as a gas, or methanol stored as a liquid or gas, with oxygen to generate electrical power. The hydrogen or methanol is oxidised at the anode and oxygen is reduced at the cathode. In these cells gaseous reactants and/or products have to be diffused into and/or out of the cell electrode structures. The electrodes therefore are specifically designed to be porous to gas diffusion in order to optimise the contact between the reactants and the reaction sites in the electrode to maximise the reaction rate. The electrolyte also has to be in contact with both electrodes and in fuel cell devices may be acidic or alkaline, liquid or solid, in nature. In the proton exchange membrane fuel cell (PEMFC), whether hydrogen or methanol fuelled, the electrolyte is a solid proton-conducting polymer membrane, commonly based on perfluorosulphonic acid materials. The PEMFC is the most likely type of fuel cell to find wide application as a more efficient and lower emission power generation technology in a range of markets including stationary and portable power generation devices and as alternative engines to the internal combustion engine in transportation.

In the PEMFC the combined laminate structure formed from the membrane and the two electrodes is known as a membrane electrode assembly (MEA). The MEA will typically comprise several layers, but can in general be considered, at its basic level, to have five layers which are defined principally by their function. On either side of the membrane an anode and cathode electrocatalyst is incorporated to increase the rates of the desired electrode reactions. In contact with the electrocatalyst containing layers, on the opposite face to that in contact with the membrane, are the anode and cathode gas diffusion substrate layers. The anode gas diffusion substrate is designed to be porous and to allow the reactant hydrogen or methanol to enter from the face of the substrate exposed to the reactant fuel supply, and then to diffuse through the thickness of the substrate to the layer which contains the electrocatalyst, usually platinum metal based, to maximise the electrochemical oxidation of hydrogen or methanol. The anode electrocatalyst layer is also designed to comprise some level of the proton conducting electrolyte in contact with the same electrocatalyst reaction sites. With acidic electrolyte types the product of the anode reaction are protons and these can then be efficiently transported from the anode reaction sites through the electrolyte to the cathode layers. The cathode gas diffusion substrate is also designed to be porous and to allow oxygen or air to enter the substrate and diffuse through to the electrocatalyst layer reaction sites. The cathode electrocatalyst combines the protons with oxygen to produce water and is also designed to comprise some level of the proton conducting electrolyte in contact with the same electrocatalyst reaction sites. Product water then has to diffuse out of the cathode structure. The structure of the cathode has to be designed such that it enables the efficient removal of the product water. If water builds up in the cathode, it becomes more difficult for the reactant oxygen to diffuse to the reaction sites, and thus the performance of the fuel cell decreases. In the case of methanol fuelled PEMFCs, additional water is present due to the water contained in the methanol, which can be transported through the membrane from the anode to the cathode side. The increased quantity of water at the cathode requires removal. However, it is also the case with proton conducting membrane electrolytes, that if too much water is removed from the cathode structure, the membrane can dry out and the performance of the fuel cell also decreases.

The complete MEA can be constructed by several methods. The electrocatalyst layers can be bonded to one surface of the gas diffusion substrates to form what is known as a gas diffusion electrode. The MEA is then formed by combining two gas diffusion electrodes with the solid proton-conducting membrane. Alternatively, the MEA may be formed from two porous gas diffusion substrates and a solid proton-conducting polymer membrane catalysed on both sides; or indeed the MEA may be formed from one gas diffusion electrode and one gas diffusion substrate and a solid proton-conducting polymer catalysed on the side facing the gas diffusion substrate.

Gas diffusion substrates or electrodes are employed in many different electrochemical devices in addition to fuel cells, including metal-air batteries, electrochemical gas sensors, and electrochemical reactors for the electrosynthesis of useful chemical compounds.

Traditionally, the gas porous substrates used in the PEMFC are based on high density materials such as rigid carbon fibre paper (e.g. Toray TGP-H-60 or TGP-H-90 from Toray Industries Inc., Japan) or woven carbon cloths, such as Zoltek PWB-3 (Zoltek Corporation, 3101 McKelvey Road, St. Louis, Mo. 63044). These materials present a number of problems in terms of cost, compatibility with high volume manufacturing processes and adaptability to the characteristics required for a wide range of cell designs and operating regimes. Current estimates suggest that these types of material are at least an order of magnitude too expensive for many applications, particularly for transportation, and their physical structure cannot be readily modified to ensure compatibility with the range of operating conditions envisaged. With existing carbon fibre papers the rigidity of the material precludes the development of high volume reel to reel processes, which offer the most attractive route for the manufacture of the quantities of MEAs required. Carbon cloths could be used in reel to reel processes but their dimensional instability and tendency to fray at cut edges impose significant additional difficulties in scaling up to high volume processes. For PEMFC's to become commercially viable power sources over a range of applications the gas porous substrate will require a manufacturing process capable of producing millions of square metres of material at very low cost and able to impart specific structural properties to the material for each application.

More recently, flexible electrode structures based on a porous substrate comprising a non-woven web of carbon fibres, with a particulate material embedded within the fibre web as disclosed in EP 0 791 974 have shown comparable performances to structures based on carbon fibre paper or cloth, without the drawbacks previously outlined. Such materials fulfil the requirement for a process capable of delivering a range of materials with specific structural properties as disclosed in PCT patent applications PCT/

GB00/00390 and PCT/GB00/00382 giving a physically strong, dimensionally stable and handleable web at a cost compatible with motive power applications. One outstanding issue with webs based on a non-woven fibre web with an embedded particulate material is that the structure has a significant degree of compressibility. This characteristic can pose problems when there are a large number of MEAs in a fuel cell stack, due to the large movement on compression of the MEAs in the stack during assembly. Also in stack designs with particularly wide flow field channels in the fuel and oxidant plates there can be a tendency for the substrate to distort into the channels restricting the gas flow and reducing the stack performance.

Accordingly, the present invention provides a non-woven fibre web comprising a plurality of first fibres orientated in the x-, y- and optionally z- directions, said first fibres being bonded with a polymeric substance, characterised in that one or more continuous strands are embedded within the sub-surface layer of the non-woven fibre web, each continuous strand comprising a plurality of second carbon fibres.

The second fibres in the one or more continuous strands may be present in the form of a tow or yarn. A tow is an essentially parallel collection of synthetic fibres preparatory to spinning, and a yarn is a continuous twisted strand of two or more fibres. When two or more continuous strands are embedded within the sub-surface layer of the web, the fibre(s) in each continuous strand may be in the form of a tow or yarn, or a combination thereof.

The first fibres are suitably selected from the group consisting of longer fibres and shorter fibres, or a combination of longer and shorter fibres. The longer fibres are of average length greater than 3 mm and suitably have a maximum average length of 50 mm. The preferred average length of the fibres is 5 mm to 30 mm. The diameter of the longer fibres is typically in the range of 0.2 microns to 25 microns, preferably in the range of 2 microns to 20 microns. The shorter fibres have an average length of less than 3 mm, suitably are of average length less than 2 mm, preferably less than 1 mm. The shorter fibres have a minimum length of 50 microns, preferably 100 microns. The diameter of the shorter fibres is typically in the range 0.1 microns to 20 microns, preferably 0.4 microns to 10 microns.

The first fibres in the non-woven fibre web are held together by a polymer or polymers (the "final polymer"). Depending on the polymeric substance(s) used it may also contribute to the essential electrode structural properties in a gas diffusion substrate or electrode, such as tensile strength, flexibility and control of the hydrophobic/hydrophilic balance. Examples of such polymers include polytetrafluoroethylene (PTFE), fluorinated ethylene-propylene (FEP), polyvinylidene difluoride (PVDF), Viton A, polyethylene, polypropylene, ethylene-propylene. The preferred final polymer is PTFE or FEP.

The or each continuous strand is embedded within the sub-surface layer of the non-woven fibre web. When more than one continuous strand is present, each continuous strand may be at an equal depth or at varying depths (i.e. variation in the z-direction) within the sub-surface layer of the web, or a combination thereof. The continuous strand(s) may be applied at any orientation and at any spacing. The continuous strand(s) may also have applied to the surface, or impregnated within the strand, a final polymer or polymers which may be the same as or, different from the final polymer in the non-woven web of fibres. Examples of such polymers include polytetrafluoroethylene (PTFE), fluorinated ethylene-propylene (FEP), polyvinylidene difluoride (PVDF), Viton A, polyethylene, polypropylene, ethylene-propylene. The preferred final polymer is PTFE or FEP.

The or each continuous strand(s) are made up of a plurality of second carbon fibres, and suitably comprise at least 100 fibres. The total number of carbon fibres in each strand will depend on the required thickness of the web and the application for which it is to be used. The maximum length of the second fibres is determined by the dimensions of the web and the orientation of the continuous strand within the web. For example, the continuous strand may extend from one edge of the web to any one of the other edges, or the continuous strand may extend from one edge of the web to the same edge. In all cases, the length of the second, carbon fibres will be dependent on the length of the continuous strand. The diameter of the second, carbon fibres is typically in the range of 0.2 microns to 25 microns, preferably in the range of 2 microns to 20 microns. The final profile of the strand(s) within the web will depend on the number and thickness of fibres in the strand and the final thickness of the web.

Fibres that are suitable for use for the first fibres include carbon, glass, silica, quartz, polymer, metal, or ceramic fibres or a combination thereof, preferably carbon, carbon wool, silica, quartz, metal or ceramic, most preferably carbon; or quartz. In one embodiment of the invention, suitably at least some of the first fibres are carbon.

The non-woven fibre web may be made by a single individual process or by adapting a continuous manufacturing process, such as paper making, to form a continuous web. In both cases the first fibres are dispersed as a suspension in, preferably water, to form a slurry. Also added to the slurry are one or more polymers (the "first polymer"), preferably hydrophilic polymers, for example polyvinylalcohol (PVA). The first polymer may be in the form of fibres. Once first fibres and the first polymer are uniformly dispersed in the liquid, the resultant slurry is drained through a suitable mesh in order to form a coherent layer of the non-woven fibre web. In the case of a single individual process the fibres are deposited onto a mesh in a conventional hand sheet maker the deposition process being preformed as a series of layers, the continuous strand(s) of carbon fibres being introduced onto the required deposited layer so that each strand or group of strands is placed at the desired sub-surface level within the final sheet. When formed into a continuous structure by the controlled deposition of the slurry onto a moving mesh belt the continuous strand(s) of carbon fibres are introduced onto the deposited layer at the appropriate point in the deposition process so that each strand is placed at the desired sub-surface level within the web. The sheet or web so-formed is dried in an oven to set the first polymer. If necessary the sheet or web is placed in a solution of the final polymer, which may or may not be the same as the first polymer, allowed to dry and subsequently heat-treated to set the final polymer. If it is not desirable for the first polymer to remain in the final web structure, it may be removed by this heat treatment or by an alternative appropriate process. In addition, any undesirable residues may be removed by the heat treatment or by an alternative appropriate process.

A second embodiment of the invention provides a gas diffusion substrate comprising a non-woven fibre web as hereinbefore defined and a filler material, characterised in that the filler material comprises a base filler material and optionally one or more modifier materials. For electrochemical applications, the base filler material forms the porous matrix for the purpose of providing suitable gas diffusion and electrical conductivity and water management properties when employed as a gas diffusion substrate for electrochemical applications. The base filler may also acts to retain the modifier material, or materials, which can modify the gas porosity and water management properties of the structure. Suitably, the final thickness of the substrate for PEMFC applications is in the range of 100–400 µm.

Suitably, the base filler material comprises a particulate carbon and a polymer, the carbon suitably being in the form of a powder. The carbon powder may be any of the materials generally designated as carbon black such as acetylene blacks, furnace blacks, pitch coke based powders and graphitised versions of such materials. Suitably also both natural and synthetic graphites may be used in this application. Such materials may be used either alone or in combination. The particulate carbon, or carbons, in the fill are held together by one or more polymers. The polymeric materials used will contribute to the essential electrode structural properties such as pore size distribution, hydrophobic/hydrophilic balance and physical strength of the gas diffusion layer. Examples of such polymers include polytetrafluoroethylene (PTFE), fluorinated ethylene-propylene (FEP), polyvinylidene difluoride (PVDF), Viton A, polyethylene, polypropylene, ethylene-propylene. The preferred final polymer is PTFE or FEP.

The base filler material may further comprise a catalyst other than an electrocatalyst, for example a gas phase catalyst, which is designed to remove contaminant gases in the fuel or oxidant feed streams such as for example carbon monoxide in the hydrogen fuel, when this is supplied from a reformer.

The modifier material, or materials, may be added to the base filler material in order to modify the structure, influencing such properties as density, water management and gas diffusion. Suitably, the one or more modifier materials are essentially spherical or fibrous materials based on carbon, glass, silica or ceramics, which may be hollow, porous or solid. By the term "essentially spherical", we mean that the modifier material may be spherical, spheroidal, ellipsoidal or any shape which approximates to a sphere, spheroid or ellipsoid. By the term "fibrous", we mean that the modifier material is of a fibrous nature, i.e. its length is far greater than its width or diameter; in general the fibres would not be longer that approximately 3 mm. Specific examples of the modifier material include carbon wool, quartz wool, silica micro-fibres, blown ceramic fibres, carbon micro-spheres, glass micro-spheres, colloidal or fumed silica and zeolites.

Further descriptions of the base filler material and the modifier material may be found in PCT application PCT/GB00/00382 which is incorporated herein by reference.

The most suitable method for the manufacture of the gas diffusion substrate is to prepare the non-woven fibre web, for example using the method hereinbefore described, and subsequently in-filling with the base filler material and where appropriate the modifier material or materials. The majority of the material used as the filler will be forced into the structure of the non-woven fibre web, although a small quantity may remain on the surface. Alternatively, a continuous manufacturing process similar to that used to prepare the non-woven fibre web may be used, the base filler material and where appropriate the modifier material or materials being added to the slurry.

A third aspect of the invention provides a gas diffusion electrode comprising a gas diffusion substrate as hereinbefore described and an electrocatalyst material. The electrocatalyst material is applied as a thin layer to the surface of the gas diffusion substrate. Some of the electrocatalyst material may penetrate slightly into the substrate, the remaining material forming a layer on the surface of the substrate. The electrocatalyst material comprises one or more electrocatalytic components and a polymer. Suitable polymers include hydrophobic polymers, such as PTFE and/or proton conducting polymers, such as Nafion®. The electrocatalytic component is defined as a substance that promotes or enhances the rate of the electrochemical reaction of interest but remains unaltered by the reaction. The electrocatalytic component or components selected will depend on the application for which the gas diffusion electrode is being used. These may be, for example, a precious metal or a transition metal as the metal or metal oxide, either unsupported or supported in a dispersed form on a carbon support; an organic complex, in the form of a high surface area finely divided powder or fibre, or a combination of these options. An example of a suitable electrocatalyst material is described in EP 0731520.

When the non-woven fibre web of the invention is used as the base structure for a gas diffusion substrate or electrode, it significantly reduces the compressibility of the substrate or electrode and consequently reduces the amount of movement experienced during compression of the stack during assembly. In stack designs with particularly wide flow field channels in the fuel and oxidant plates the tendency for the electrode or substrate to distort into the channels, restricting the gas flow, is significantly reduced. This will be of a particular advantage with fuel cell stacks operating at ambient pressure where the flow field channels are usually relatively wide.

A fourth aspect of the invention provides a membrane electrode assembly comprising a gas diffusion electrode of the invention as hereinbefore defined and a second gas diffusion electrode and a solid polymer membrane. Alternatively, the invention provides a membrane electrode assembly comprising a gas diffusion electrode of the invention as hereinbefore defined, a gas diffusion substrate and a solid polymer membrane, wherein an electrocatalyst layer is applied to the side of the membrane facing the gas diffusion substrate. Alternatively, the invention provides a membrane electrode assembly comprising a gas diffusion substrate of the invention as hereinbefore defined, a gas diffusion electrode and a solid polymer membrane, wherein an electrocatalyst layer is applied to the side of the membrane facing the gas diffusion substrate. Alternatively, the invention provides a membrane electrode assembly comprising a gas diffusion substrate of the invention as hereinbefore defined and a second gas diffusion substrate and a solid polymer membrane, wherein an electrocatalyst layer is applied to both sides of the solid polymer membrane.

A still further aspect of the invention provides a fuel cell comprising a gas diffusion substrate according to the present invention. A further aspect provides a fuel cell comprising a gas diffusion electrode according to the present invention. A further aspect provides a fuel cell comprising a membrane electrode assembly according to the invention.

Other applications for which one or more of the embodiments of the invention may be used, in addition to fuel cells, include, but are not limited to, metal-air batteries, electrochemical gas sensors, electrochemical reactors for the electrosynthesis of useful chemical compounds and separator mats for batteries. Non-electrochemical applications of the non-woven fibre web include, but are not limited to, composite materials for cryogenic insulation, composite reinforcement in areas such as plastics, cements, printed circuit boards, sports goods etc, for insulation purposes, military applications, automotive structural components, brakes, gaskets, transmission units etc and for filtration applications.

The invention will now be further described with reference to the following examples.

COMPARATIVE EXAMPLE 1

Preparation of a Web 0.5 g of chopped carbon fibres at a fibre length of 6 mm, and 0.5 g of chopped carbon fibres at a fibre length of 12 mm (type RK 10 supplied by RK Carbon Fibres Ltd.) along with 0.5 g of carbon fibre wool (type FRC 15 supplied by Le Carbone (Great Britain) Ltd., Portslade, Sussex, UK) and 0.13 g of polyvinyl alcohol fibres (type Mewlon SML supplied by Unitika Ltd., Oska 541, Japan) were dispersed in 3 litres of water using a standard catering blender. The resulting dispersion was used to prepare a sample of non-woven sheet of size 330 mm diameter (855.3 $cm^2$) in a custom built sheet former (similar in general operation to a standard SCA sheet former, as supplied by AB Lorentzen & Wettre, Box 4, S-163 93 Stockholm, Sweden). The sheet was dried at 100° C. in air. The dried sheet was replaced on the base mesh of the hand sheet former and the sheet former was then refilled with water. A further dispersion of 0.5 g of 6 mm chopped carbon fibres, 0.5 g of 12 mm chopped carbon fibres, 0.5 g of FRC15 carbon fibre wool and 0.13 g of polyvinyl alcohol fibres, dispersed in 3 litres of water, was placed in the sheet maker and deposited onto the first non-woven sheet. The final sheet was dried at 100° C. in air.

COMPARATIVE EXAMPLE 2

Preparation of a Substrate

A non-woven carbon fibre sheet was prepared as in Comparative Example 1. The sheet was placed on a sheet of PTFE (skived sheet from Dalau Ltd., Clacton-on-sea, Essex, UK) and sprayed with a suspension of PTFE 2.3 g (ICI Fluon dispersion GP1, 64 wt % solids suspension) in 10 g of water. Half of the suspension was sprayed on the first side, the sheet dried at 120° C., and the other side sprayed with the remaining suspension. The resulting sheet was fired, in air, to 340° C. for 15 minutes, to give a 30wt % loading of PTFE.

The particulate material used for embedding within the fibre network was provided by dispersing 47 weight parts of acetylene black (Shawinigan black from Chevron Chemicals, Houston, Tex., USA) in 1200 parts of water. To this was added 3 weight parts of PTFE as a dispersion in water (ICI Fluon dispersion GP1, 64 wt % solids suspension) and the mixture stirred to entrain the PTFE particles within the carbon black. The resultant material was dispersed using a high shear mixer (Silverson L4R) to produce a smooth mixture.

The particulate material was pressed into the non-woven carbon fibre sheet from one side, and levelled off using a metal edge. The sheet was then dried at 200° C. for 1 minute. A further thin layer of the particulate material was applied to the same side; the structure was sandwiched between two sheets of filter paper and passed through a set of rollers to compact the layer. The sheet was then dried at 200° C. for 1 minute. This process was repeated for the second side. Further additions of thin layers of the particulate material were applied alternately to each side, with compaction and drying, until a loading of 33 mg/$cm^2$ of carbon was achieved. The resulting gas diffusion substrate sheet was fired, in air, to 300° C. for 30 minutes.

EXAMPLE 1

Preparation of Web 0.5 g of 6 mm chopped carbon fibres, 0.5 g of 12 mm chopped carbon fibres (both type RK 10) along with 0.5 g of carbon fibre wool (type FRC 15) and 0.13 g of polyvinyl alcohol fibres (type Mewlon SML) were used to prepare a non-woven sheet of size 330 mm diameter (855.3 $cm^2$) in a custom built sheet former as in Comparative Example 1. The sheet was dried at 100° C. in air.

The dried sheet was replaced on the base mesh of the hand sheet former and a series of straight lengths of carbon tow (type HTS 5131 200TEX F 3000 T 0, supplied by Akzo Nobel Fibres Ltd., Enkalon House, Leicester, UK) were spaced at 1 cm intervals across the surface of the non-woven sheet using a jig to hold the strands in place under tension.

The sheet former was then refilled with water and a further dispersion of 0.5 g of 6 mm chopped carbon fibres, 0.5 g of 12 mm chopped carbon fibres, 0.5 g of FRC15 carbon fibre wool and 0.13 g of polyvinyl alcohol fibres, dispersed in 3 litres of water, was placed in the sheet maker and deposited onto the first non-woven sheet and carbon tow. The final sheet was dried at 100° C. in air.

EXAMPLE 2

Preparation of Substrate

A non-woven carbon fibre sheet containing strands of carbon fibre tow was prepared as for Example 1. The dried sheet was coated with PTFE and filled with a carbon/PTFE mixture as described in Comparative Example 2.

Preparation of Machine-made Web

A non-woven carbon fibre sheet containing, within one half of the 1 metre width, strands of carbon fibre tow at a spacing of 20 mm centres, was fabricated on a wet-laid papermaking machine at a grammage of 16 g/$m^2$. The ratio of chopped carbon fibre to carbon fibre wool was as for the samples prepared in Comparative Example 1. In place of the PVA fibre binder a polyester emulsion binder was applied to the sheet after formation on the wire and prior to removing from the couch roll.

COMPARATIVE EXAMPLE 3

Web

A sample sheet was removed from an area of the roll of machine-made web prepared, above where there were no tow strands.

EXAMPLE 3

Web

A sample sheet was removed from an area of the roll of machine-made web prepared above where the tow strands were located.

EXAMPLE 4

Substrate

A sample sheet was removed from an area of the roll of machine-made web prepared above where the tow strands were located. The sheet was coated with PTFE and filled with a carbon/PTFE mixture as described in Comparative Example 2.

Test samples of size 60 mm×60 mm, cut from the sheets prepared in Comparative Examples 1, 2 and 3 and Examples 1, 2, 3 and 4 were evaluated for their compressibility using a Houndsfield H5K-S Materials Testing Machine fitted with 50 mm diameter compression anvils and a 1KN load cell. A progressive compression from 1N to 250N stress from 5KPa to 1000Kpa was applied and the reduction in thickness with pressure compressive strain was measured. The percentage compression compressive strain for each sample is shown on the following table.

| Sample | Grammage g/m$^2$ | Thickness at 5 Kpa/mm | Compressive Strain (%) @ 509 KPa |
|---|---|---|---|
| Comparative Example 1 | 25.7 | 0.346 | 68 |
| Example 1 | 25.7 | 0.443 | 55.7 |
| Comparative Example 2 | 22.3 | 0.305 | 50.2 |
| Example 2 | 25.7 | 0.317 | 36.3 |
| Comparative Example 3 | 16.0 | 0.254 | 62.5 |
| Example 3 | 16.0 | 0.260 | 46.7 |
| Example 4 | 16.0 | 0.258 | 25.7 |

An open web as in Comparative Example 1 shows a very much higher percentage compression due to the very open and flexible nature of the web, which is significantly reduced when single lengths of carbon tow (at a spacing of 1 cm) are incorporated into the structure as shown by Example 1. As can be seen from Comparative Example 2 and Example 2 the inclusion of the carbon/PTFE fill not only improves the compressibility of the web, but also translates through to a benefit on the gas diffusion substrate made from the web by filling it with carbon. The differences observed with the machine-made web (Comparative Example 3 and Example 3) show exactly the same trend, but are even more marked.

What is claimed is:

1. A gas diffusion substrate comprising:
   a non-woven web comprising a plurality of first fibers, at least one continuous strand, and a sub-surface layer, wherein said first fibers are oriented in either the x- and y-direction or the x-, y- and z-direction in the sub-surface layer and are bonded with a polymeric substance, wherein each continuous strand of said at least one continuous strand is embedded within said sub-surface layer among the first fibers and comprises a plurality of second fibers wherein said second fibers are carbon fibers, wherein at least a portion of said at least one continuous strand and at least one of said first fibers are positioned at the same sub-surface level; and
   a filler material, wherein said filler material comprises either a base filler material or a base filler material and at least one modifier material.

2. A gas diffusion substrate according to claim 1, wherein said at least one continuous strand comprises a plurality of continuous strands which are embedded within said sub-surface layer at equal or varying depths or a combination thereof.

3. A gas diffusion substrate according to claim 1, further comprising a polymer applied to a surface of or impregnated within said at least one continuous strand.

4. A gas diffusion substrate according to claim 1, wherein said plurality of second fibers is at least 100 carbon fibers.

5. A gas diffusion substrate according to claim 1, wherein a diameter of each second fiber of said plurality of second fibers is in the range of 0.2 microns to 25 microns.

6. A gas diffusion substrate according to claim 1, wherein said first fibers are selected from the group consisting of fibers having an average length greater than 3 mm, fibers having an average length less than 3 mm, and a combination thereof.

7. A gas diffusion substrate according to claim 1, wherein said first fibers are selected from the group consisting of carbon, carbon wool, glass, silica, quartz, polymer, metal fibers, ceramic fibers, and combinations thereof.

8. A gas diffusion substrate according to claim 1 wherein the base filler material comprises a particulate carbon and a polymer.

9. A gas diffusion substrate according to claim 1, wherein the base filler material further comprises a catalyst other than an electrocatalyst.

10. A gas diffusion electrode comprising a gas diffusion substrate according to claim 1 and an electrocatalyst material.

11. A gas diffusion electrode according to claim 10, wherein said electrocatalyst material comprises at least one electrocatalytic component and a polymer.

12. A gas diffusion electrode according to claim 11, wherein said at least one electrocatalytic component is a precious metal or a transition metal as a metal or metal oxide, either unsupported or supported in a dispersed form on a carbon support, an organic complex in the form of a high surface area finely divided powder or fiber, or a combination thereof.

13. A membrane electrode assembly comprising a gas diffusion electrode according to claim 10, a second gas diffusion electrode, and a solid polymer membrane.

14. A fuel cell comprising a membrane electrode assembly according to claim 13.

15. A fuel cell comprising a gas diffusion electrode according to claim 10.

16. A gas diffusion electrode according to claim 10, wherein said electrocatalyst material comprises a precious metal or a transition metal as a metal or metal oxide, either unsupported or supported in a dispersed form on a carbon support, an organic complex in the form of a high surface area finely divided powder or fiber, or a combination thereof.

17. A fuel cell comprising a gas diffusion substrate according to claim 1.

* * * * *